United States Patent [19]

Nishimura et al.

[11] Patent Number: 4,803,650

[45] Date of Patent: Feb. 7, 1989

[54] METHOD OF CONFIGURING AN N-TH DEGREE SWITCHED CAPACITOR FILTER

[75] Inventors: Toshimichi Nishimura; Atsushi Kikuchi, both of Kanagawa, Japan

[73] Assignee: Sony Corporation, Tokyo, Japan

[21] Appl. No.: 846,192

[22] Filed: Mar. 31, 1986

[30] Foreign Application Priority Data

Apr. 8, 1985 [JP] Japan .................................. 60-73892

[51] Int. Cl.$^4$ .......................................... G06G 7/02
[52] U.S. Cl. ................................. 364/825; 333/173
[58] Field of Search ............... 364/802, 807, 825, 828, 364/839, 861, 602, 605, 724; 333/165–167, 173–174; 307/109–110

[56] References Cited

U.S. PATENT DOCUMENTS

| | | | |
|---|---|---|---|
| 4,354,169 | 10/1982 | Nossek | 333/173 |
| 4,356,464 | 10/1982 | Fettweis | 333/173 |
| 4,364,116 | 12/1982 | Nossek | 364/825 |
| 4,378,538 | 3/1983 | Gignoux | 333/173 |
| 4,470,126 | 9/1984 | Haque | 364/825 |
| 4,475,170 | 10/1984 | Haque | 364/825 |
| 4,633,425 | 12/1986 | Senderowicz | 364/825 |

*Primary Examiner*—Gary V. Harkcom
*Attorney, Agent, or Firm*—Ronald P. Kananen

[57] ABSTRACT

An n-th degree switched capacitor filter having transfer characteristics expressed by a transfer function $H(Z)$ can be configured by expanding the transfer function $H(Z)$ to an n-element linear simultaneous state equation of n state voltages inclusive of an output voltage. The coefficients of the linear state equation $a_{11}$ to $a_{n2}$, $b_{11}$ to $b_{nn}$ are determined in a range within which the filter circuit can be configured by hardware and further each state voltage is below a maximum output voltage. In practice, the filter is configured by plural leapfrog type differential operational amplifiers having base capacitors $C_o$, plural transmission gates, and plural electric charge transfer capacitors $C_T$ so as to determine each coefficient on the basis of ratios $C_T/C_o$. The filter is realized by a monolithic integrated circuit (IC) and provided with a higher signal-to-noise (S/N) ratio and a wider dynamic range without deteriorating electrical characteristics and increasing cost.

4 Claims, 4 Drawing Sheets

QUADRATIC SWITCHED-CAPACITOR FILTER $V_I$ ... INPUT VOLTAGE
$V_1, V_2$ ... INNER STATE VOLTAGE
$a_{11} \sim a_{22}$, $b_{11} \sim b_{22}$ ... COEFFICIENTS

QUADRATIC FILTER STATE DIAGRAM

FLOWCHART FOR DETERMINING OPTIMUM COEFF. IN QUADRATIC STATE EQUATION

QUADRATIC SWITCHED-CAPACITOR FILTER

N-TH FILTER STATE DIAGRAM

LINEAR FILTER STATE DIAGRAM

METHOD OF CONFIGURING AN N-TH DEGREE SWITCHED CAPACITOR FILTER

BACKGROUND OF THE INVENTION

1. Field of the Invention

The present invention relates to a method of configuring any given n-th degree filter, and more particular to a method of configuring an n-th degree filter preferably applied to a switched-capacitor filter.

2. Description of the Prior Art

Conventionally, LC filters composed of coils and capacitors are well known as filter circuits. However, since these LC filters are large in size and high in cost, recently configuring filters by use of integrated circuits has been studied.

As methods of configuring such IC filters as described above, gyrators, active filters, digital filters, switched-capacitor filters, and so forth, have been considered. In particular, however, the switched-capacitor filters have been highlighted owing to various advantages such as a high possibility of realizing the filters by monolithic IC's using MOS transistors, excellent electric characteristics, wide applicable fields, low cost, and so forth.

However, thus far only leapfrog type and bi-quad type have been known as methods of configuring the switched-capacitor filters, and no method of configuring a filter which can realize any given n-th degree transfer function has been known.

In particular, in the case where a filter for a video signal band is required to be configured, a switching speed as high as 40 times higher than the reproduction band is required for the leapfrog type switched-capacitor filter. Further, in the case of the bi-quad type switched-capacitor filter, the method of determining the coefficients has not yet been well known, so that a deviation in coefficients is readily produced, thus causing problems in that the filter is unstable or it is impossible to realize the filter.

SUMMARY OF THE INVENTION

With these problems in mind, therefore, it is the primary object of the present invention to provide a method of configuring an n-th degree switched capacitor filter which can correspond to any given n-th degree transfer functions. Further, it is another object of the present invention to provide a method of configuring an n-th degree switched capacitor filter in which each coefficient of the n-th degree filter can be determined readily and reasonably.

To achieve the above-mentioned object, the method according to the present invention is characterized in that, in a method of configuring an n-th degree switched capacitor filter having transfer characteristics expressed by $$H(z) = \frac{\alpha_n z^{-n} + \alpha_{n-1} z^{-n+1} + \ldots + \alpha_1 z^{-1} + \alpha_0}{\beta_n z^{-n} + \beta_{n-1} z^{-n+1} + \ldots + \beta_1 z^{-1} + \beta_0}$$

as a given n-th degree transfer function $H(z)$, the above n-th degree transfer function $H(z)$ is expanded in the form of an n-element linear simultaneous state equation of n state voltages $V_1$ to $V_n$ inclusive of the last-stage output voltage as $$\begin{bmatrix} V_1 \\ \vdots \\ V_n \end{bmatrix} = \begin{bmatrix} a_{11} a_{12} z^{-1} \\ \vdots \\ a_{n2} a_{n2} z^{-1} \end{bmatrix} \begin{bmatrix} V_I \\ V_I \end{bmatrix} + \begin{bmatrix} b_{11} z^{-1} \ldots b_{1n} z^{-1} \\ \vdots \\ b_{n1} z^{-1} \ldots b_{nn} z^{-1} \end{bmatrix} \begin{bmatrix} V_1 \\ \vdots \\ V_n \end{bmatrix}$$

where $V_I$ denotes an input voltage, in order to configure a filter circuit corresponding to the above state equation.

Further, in the above-mentioned method of configuring an n-th degree filter having the above-mentioned feature, the other aspect of the present invention is further characterized in that each coefficient $a_{11}$ to $a_{n2}$, $b_{11}$ to $b_{nn}$ of the above state equation is changed in a range within which the filter circuit can be configured by hardware with each coefficient as a variable; a group of coefficients $a_{11}$ to $a_{n2}$ and $b_{11}$ to $b_{nn}$ is so determined that each state voltage $V_1$ to $V_n$ is below a finally-obtained maximum output voltage; and a filter circuit corresponding to the above simultaneous state equation having each coefficient determined as described above is configured.

In brief, a main feature of the present invention is as follows. In a method of configuring an n-th degree switched capacitor filter having transfer characteristics expressed by a given n-th degree transfer function, the n-th degree transfer function is expanded to a state equation expressed by an n-element linear simultaneous equation with respect to n state voltages inclusive of an output voltage to configure a filter corresponding to the above state equation; and each coefficient of the state equation is determined in a range within which the filter circuit can be configured by hardware; and further each state voltage is below a maximum output voltage in order to readily configure an n-th degree filter corresponding to any given n-th degree transfer function while satisfying appropriate characteristics.

BRIEF DESCRIPTION OF THE DRAWINGS

The features and advantages of the method of configuring an n-th degree switched capacitor filter according to the present invention will be more clearly appreciated from the following description of the preferred embodiment of the invention taken in conjunction with the accompanying drawings in which.

DETAILED DESCRIPTION OF THE PREFERRED EMBODIMENTS

Figure 1:
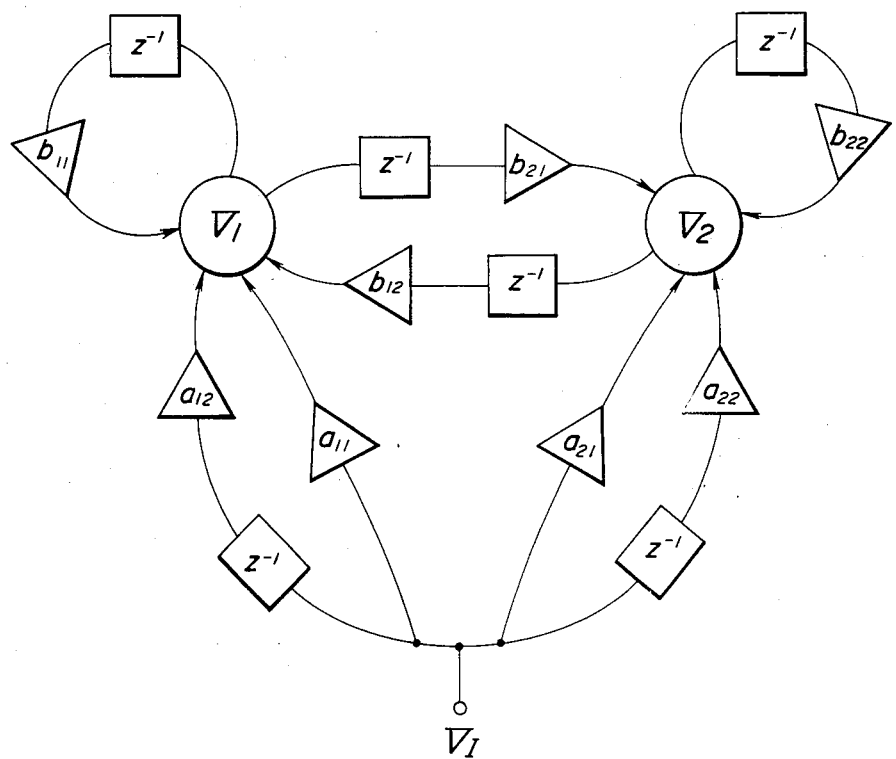
FIG. 1 is a state diagram corresponding to the one obtained by expanding the transfer function of a quadratic filter to a two-element linear simultaneous state equation.

With reference to the attached drawings, reference is now made to the method according to the present invention.

Basic Principle

The basic principle of the method of configuring an n-th degree switched capacitor filter related to the present invention will first be described. In digital filters, in general, configurations for generating an output by linearly-coupling n-piece past inputs have been well known. However, in such a filter as a switched capacitor for implementing analog calculations, the method of using large amounts of past data is not appropriate because the signal conserving capacity is not sufficient. To overcome this problem, in the case of filters for realizing an n-th degree transfer function, there has been adopted a so-called linear state method such that each state voltage is changed into $V_1(N)$ to $V_n(N)$ according to incoming input voltages $V_1(N)$ by use of a group of n-piece inner state voltages $V_1$ to $V_n$ of the filter circuit and an input voltage $V_I$, when each voltage reaches $V_1(N-1)$ to $V_n(N-1)$, in correspondence to the present filter state. In this method, the succeeding state can be determined on the basis of only an input voltage $V_I$ prior to one unit time and the states of the inner state voltages $V_1$ to $V_n$. Thereby, the number of signals to be conserved is that corresponding to one unit of time, or one clock period. Therefore, this method is suitable for the switched capacitor filters based mainly upon analog calculations. Further, a digital filter can be configured in accordance with this method in such a way that an output voltage $V_o$ is generated by selecting any one or more signals from the inner state voltages $V_1$ to $V_n$.

Method of configuring a quadratic filter

By way of example of such a linear state method as described above, a method of configuring a quadratic filter will be described hereinbelow.

When the following equation is given as a quadratic transfer function $H(z)$ $$H(z) = \frac{\alpha_2 z^{-2} + \alpha_1 z^{-1} + \alpha_0}{\beta_2 z^{-2} + \beta_1 z^{-1} + 1} \quad (1)$$

and a quadratic filter for realizing the above transfer function (1) is required to be configured, it is possible to obtain a two-element linear simultaneous state equation with respect to two inner state voltages $V_1(z)$, and $V_2(z)$ of the quadratic filter as follows:

$$\begin{bmatrix} V_1(z) \\ V_2(z) \end{bmatrix} = \begin{bmatrix} a_{11} & a_{12}z^{-1} \\ a_{21} & a_{22}z^{-1} \end{bmatrix} \begin{bmatrix} V_I(z) \\ V_I(z) \end{bmatrix} + \begin{bmatrix} b_{11}z^{-1} & b_{12}z^{-1} \\ b_{21}z^{-1} & b_{22}z^{-1} \end{bmatrix} \begin{bmatrix} V_1(z) \\ V_2(z) \end{bmatrix} \quad (2)$$

where $V_I(z)$ denotes an input voltage. The above equation (2) can be rewritten as follows;

$$V_1(z) = (a_{11} + a_{12}z^{-1})V_I(z) + b_{11}z^{-1}V_1(z) + b_{21}z^{-1}V_2(z) \quad (2')$$
$$V_2(z) = (a_{21} + a_{22}z^{-1})V_I(z) + b_{21}z^{-1}V_1(z) + b_{22}z^{-1}V_2(z)$$

When the input voltage $V_1(z)$, for instance, is determined to be an output voltage $V_0(z)$ in the equation (2) or (2'), the output voltage $V_0(z)$ ($=V_1(z)$) is obtained by eliminating the inner state voltage $V_2(z)$ as follows:

$$V_0(z) = \quad (3)$$

$$\frac{(b_{12}a_{22} - a_{12}b_{22})z^{-2} + (b_{12}a_{21} - a_{11}b_{22} + a_{12})z^{-1} + a_{11}}{(b_{11}b_{22} - b_{12}b_{21})z^{-2} + (-b_{11} - b_{22})z^{-1} + 1} \cdot V_I(z)$$

By transforming this equation (3) as $$H(z) = V_0(z)/V_I(z)$$

and by comparing the equation (3) with the equation (1), it is possible to obtain the corresponding relationship between each coefficient $\alpha_0$ to $\beta_2$ and $a_{11}$ to $b_{22}$ as follows:

$$\begin{aligned}
\alpha_0 &= a_{11} \\
\alpha_1 &= b_{12}a_{21} - a_{11}b_{22} + a_{12} \\
\alpha_2 &= b_{12}a_{22} - a_{12}b_{22} \\
\beta_1 &= -b_{11} - b_{22} \\
\beta_2 &= b_{11}b_{22} - b_{12}b_{21}
\end{aligned} \quad (4)$$

Further, the other inner state voltage $V_2(z)$ can be expressed by eliminating $V_1(z)$ as follows:

$$V_2(z) = \quad (5)$$

$$\frac{(b_{12}a_{12} - a_{22}b_{11})z^{-2} + (b_{21}a_{11} - a_{21}b_{11} + a_{22})z^{-1} + a_{21}}{(b_{11}b_{22} - b_{12}b_{21})z^{-2} + (-b_{11} - b_{22})z^{-1} + 1} \cdot V_I(z)$$

The above $V_2(z)$ may be determined as an output voltage.

These equations (3) and (5) indicate that $V_1$ and $V_2$ have the same pole. Here, the matrix determined by the first-term coefficients $a_{11}$ to $a_{22}$ on the right side of the equation (2) is referred to as an A-matrix or an input matrix, and the matrix determined by the second-term coefficients $b_{11}$ to $b_{22}$ on the right side of the same equation (2) is referred to as a B-matrix or a pole matrix. The zero point thereof is determined by coupling these two A- and B-matrix elements. Here, the equation (2) or (2') is equivalent to a state diagram as shown in FIG. 1, which can be determined as a practical circuit configuration as it is.

That is, in FIG. 1, each voltage $V_1$ or $V_2$ (one is taken out as an output voltage $V_0$) is self-attenuated by the coefficients $b_{11}$ and $b_{22}$. In a practical circuit, the circuit is configured by operational amplifiers of a self-feedback type. The coefficients $b_{12}$ and $b_{21}$ indicate the mutual coupling of each voltage $V_1$ and $V_2$ and are configured by a so-called leapfrog circuit in which one operational amplifier mutually functions as a feedback circuit to the other operational amplifier. The coefficients $a_{11}$ to $a_{22}$ indicate the contribution of an input voltage $V_1$ to each voltage $V_1$ and $V_2$.

The method of determining each coefficient $a_{11}$ to $b_{22}$ of the above-mentioned simultaneous state equation expressed by equation (2) or (2') on the basis of each coefficient $\alpha_0$ to $\beta_2$ of the previously-given transfer function expressed by equation (1) will be described hereinbelow.

First, it is required that the absolute value of each coefficient $a_{11}$ to $b_{22}$ of the state equation should be in a range between the maximum value $M_a$ and the minimum value $M_i$ because there exists a condition on hardware in order to allow the filter circuit to be realized in practice. Additionally, with respect to the inner state voltage other than the output voltage, for instance, such as $V_2$, there exists a requirement such that if the maximum absolute value of the output voltage $V_0$ is $P(=|V_0|max)$, the maximum absolute value of $V_2$ should be less than $P(P \geq |V_2|max)$. Further, it is desired that the lower limit value $Q(|V_2|min \geq Q)$ is large enough not to deteriorate the SN ratio.

Further, as understood by the equation (4), the coefficient $a_{11}$ is $\alpha_0$ itself, and if coefficients $a_{12}$, $a_{21}$, and $a_{22}$, are determined, the remaining coefficients $b_{11}$ to $b_{22}$ can be determined unconditionally as follows:

$$\left. \begin{array}{l} b_{11} = -\dfrac{\beta_1 S_0 + S_1}{S_0} \\ b_{12} = \dfrac{S_2}{S_0} \\ b_{21} = \dfrac{-(\beta_1 S_0 + S_1)S_1 - \beta_2 S_0^2}{S_0 S_2} \\ b_{22} = \dfrac{S_1}{S_0} \end{array} \right\} \quad (6)$$

where, $$S_0 = \alpha_0 a_{22} - a_{12} a_{21}$$

$$S_1 = -\alpha_1 a_{22} + \alpha_2 a_{21} + a_{12} a_{22}$$

$$S_2 = \alpha_0 \alpha_2 - \alpha_1 a_{12} + a^2{}_{12}$$

Therefore, in practice the coefficients $a_{11}$ to $b_{22}$ which satisfy the above-mentioned conditions can be obtained by variously changing a group of these coefficients $a_{12}$ $a_{21}$, and $a_{22}$ with the coefficient $a_{12}$, $a_{21}$, or $a_{22}$ as an independent variable, respectively.

The determination of each coefficient $a_{11}$ to $b_{22}$ as described above can be made automatically by use of a computer, which will be described with reference to a flowchart shown in FIG. 2 by way of example.

Figure 2:
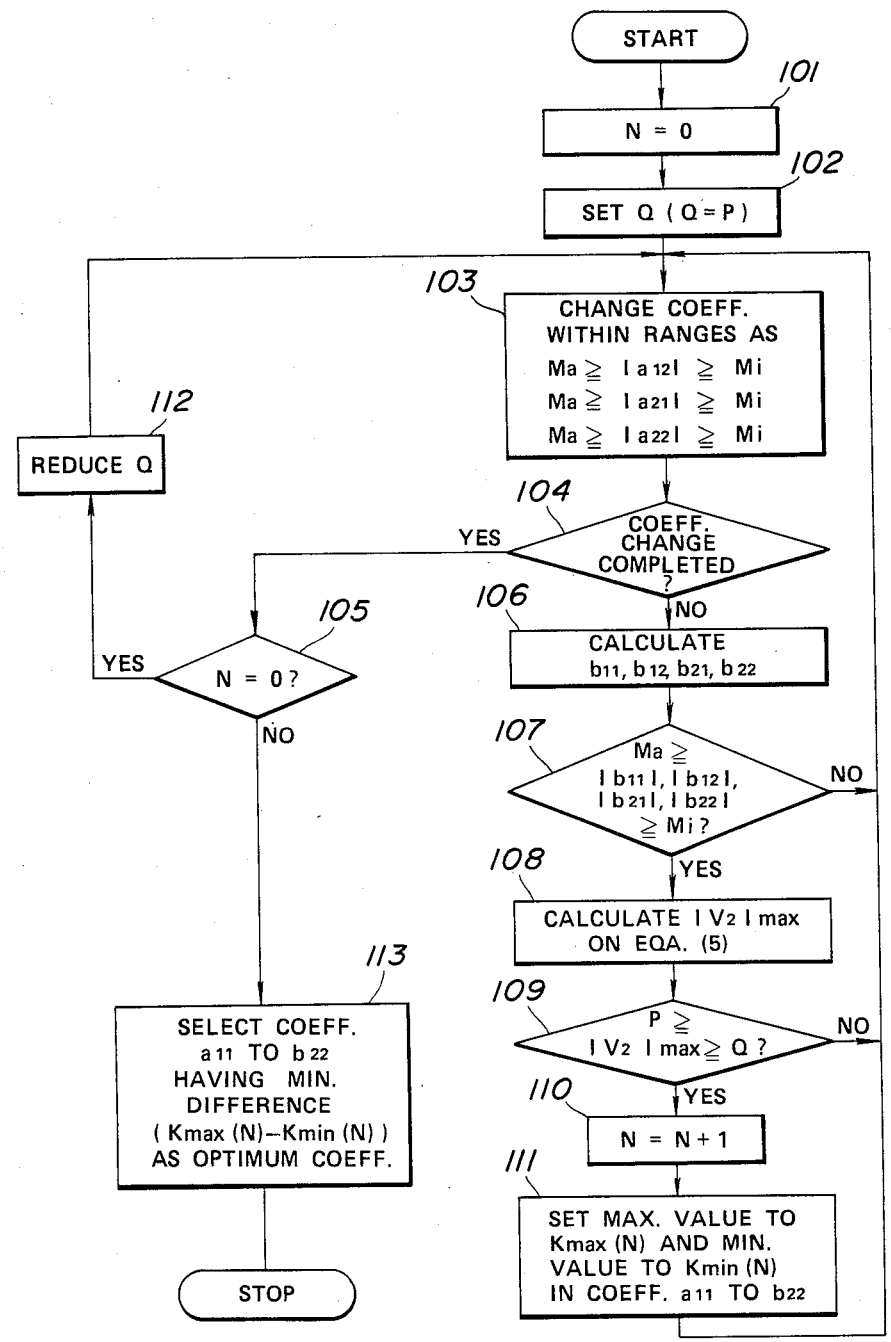
FIG. 2 is a flowchart for determining optimum coefficients of a simultaneous state equation of the quadratic filter.

In FIG. 2, first in step 101, a control sets the control variable to $N=0$ and proceeds to the next step 102 to set the lower limit value Q. In the first process, this lower limit value Q is set to a value $(Q=P)$ equal to the maximum absolute value $P(=|V_0|max)$ of the output voltage because a high S/N ratio is required. This Q is reduced as described later only where a group of coefficients $a_{11}$ to $b_{22}$ satisfying the condition is not obtained in the subsequent steps.

In the succeeding step 103, as described above the coefficients $a_{12}$, $a_{21}$, and $a_{22}$ are changed in a range within which each absolute value $|a_{12}|$, $|a_{21}|$ or $|a_{22}|$ of these coefficients lies between the upper limit Ma and the lower limit $M_i$. In this step, the form of the coefficient changes, that is, the kinds of groups of coefficients $a_{12}$, $a_{21}$, and $a_{22}$ are finite when the magnitude of the unit change, or changed steps, of each coefficient has previously been determined, so that plural kinds of coefficient groups are selected in accordance with a predetermined sequence, proceeding to the next step 104. In step 104, the control discriminates whether the above-mentioned finite coefficients change form, that is, all of the combinations of coefficients $a_{12}$, $a_{21}$, and $a_{22}$ possible have been selected i.e., the change completion. If YES, the control proceeds to step 105; if NO, control proceeds to step 106.

In step 106, the remaining coefficients $b_{11}$ to $b_{22}$ are calculated and determined on the basis of the selected coefficients $a_{12}$, $a_{21}$, and $a_{22}$ and the coefficients $\alpha_0$ to $\beta_2$ of the above transfer function in accordance with the above equation (6). In step 107, the control discriminates whether the absolute values of these coefficients $b_{11}$ to $b_{22}$ lie within a range between the above upper limit Ma and the lower limit Mi $(Ma \geq |b_{11}|, |b_{12}|, |b_{21}|, |b_{22}| \geq Mi)$. If NO, control returns to the step 103 to change the combination of the coefficients $a_{12}$, $a_{21}$, and $a_{22}$; if YES, control proceeds to step 108.

In step 108, the inner state voltage $V_2$ is calculated in accordance with the equation (5) and determines the maximum absolute value $|V_2|max$. In the succeeding step 109, control discriminates whether this $|V_2|max$ is less than the upper limit $P(=|V_0|max)$ but more than the lower limit Q. If NO, control returns to step 103; if YES, control proceeds to the next step 110.

In step 110, the control variable N is incremented $(N=N+1)$ and proceeds to the succeeding step 111. In step 111, the control determines and stores the maximum coefficient Kmax (N) and the minimum coefficient Kmin (N) from among the determined coefficients $a_{11}$ to $b_{22}$, returning to the step 103.

As described above, after all the possible combinations of coefficients have been completed i.e. the change completions, is finished, by sequentially changing the coefficients $a_{12}$, $a_{21}$, and $a_{22}$, the control determines YES in step 104 and proceeds to step 105. In this step 105, control discriminates whether the control variable N is zero or not. If YES $(N=0)$, this indicates that the combinations of coefficients $a_{11}$ to $b_{22}$ which satisfy the above condition have not been obtained. Therefore, control proceeds to the step 112 at which the lower limit value Q is reduced, thereafter returning to the step 103. In this case, in step 103, the change operation of each coefficient $a_{12}$, $a_{21}$, or $a_{22}$ is restarted from the beginning; that is, the operations from step 103 to step 111 are repeatedly excecuted for all the possible combinations of coefficients. On the other hand, if NO $(N \neq 0)$ is determined in step 105, this indicates that at least one combination of coefficients $a_{11}$ to $b_{22}$ which satisfies the condition has been obtained. In the succeeding step 113, control determines a group of coefficients having a minimum difference between the maximum coefficient value Kmax (N) and the mininum coefficient value Kmin (N) of each group from among the obtained combinations of coefficients, as an optimum combination of filter coefficients.

As described above, since the initial value of Q is determined as P $(Q=P=|V_0|max)$ and the Q is reduced gradually by checking all the combinations of coefficients $a_{12}$, $a_{21}$, and $a_{22}$ realizable by hardware, it is possible to determine the filter coefficients with a relatively high Q value. Thus, it is possible to; obtain a filter having a dynamic range of high S/N ratio.

The quadratic filter circuit expressed by the two-element linear simultaneous state equation having optimum coefficients $a_{11}$ to $b_{22}$ determined as described above can readily be configured by hardware on the basis of the state diagram shown in FIG. 1.

By way of example, there will be explained an embodiment where a switched-capacitor filter is configured in practice by a CMOS (complementary metal oxide semiconductor) circuit on the basis of the simultaneous state equation corresponding to the above filter circuit.

To realize a switched-capacitor filter, operational amplifiers, transmission gates, and capacitors, and so forth are necessary. In the case where the filter is configured independently, although a clock-noise eliminator, an input clamp circuit, a clock forming circuit, a post/pre-filter and an output circuit are additionally required, the descriptions of these circuits are omitted herein because these are not directly related to the gist of the present invention.

Figure 3:
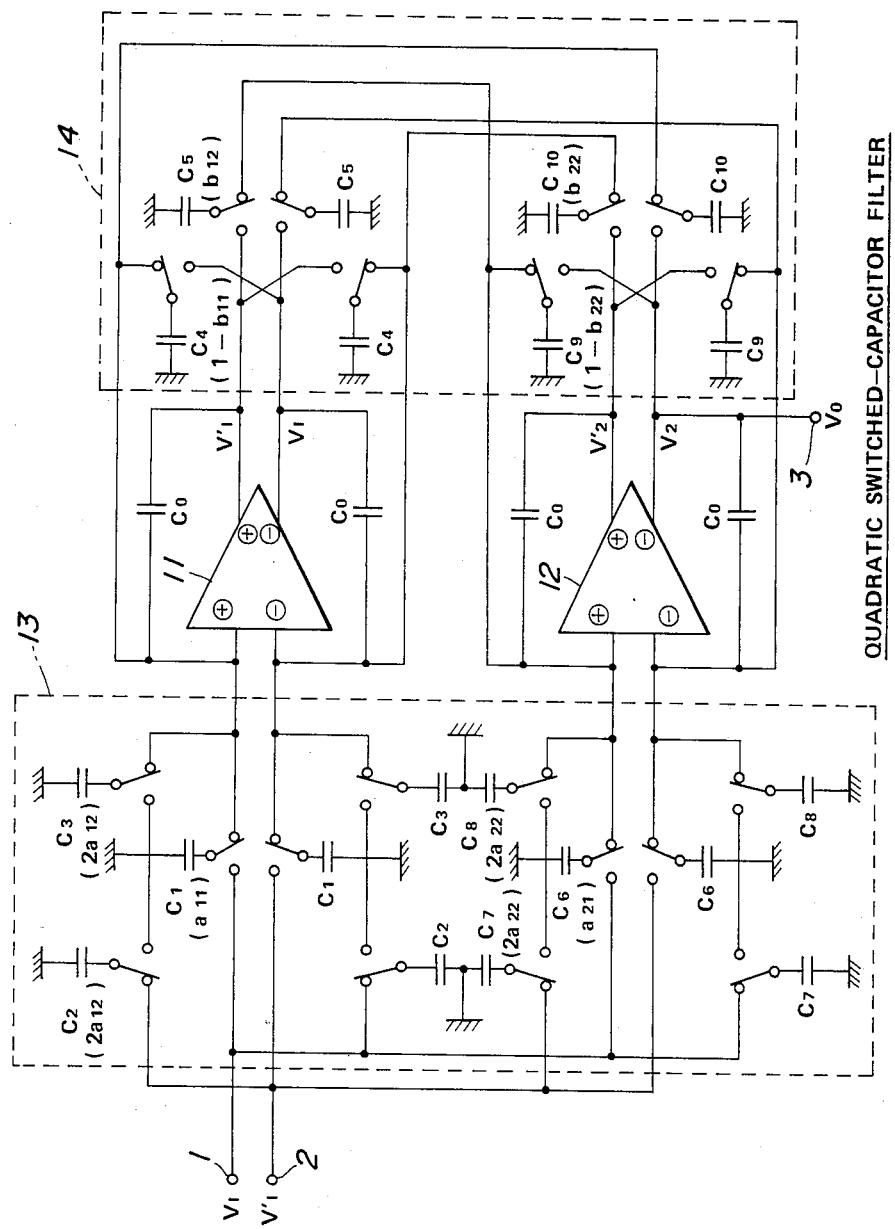
FIG. 3 is a practical circuit diagram of a quadratic switched capacitor filter configured by the two-element linear simultaneous state equation.

On the basis of the state diagram shown in FIG. 1, it is possible to configure a switched-capacitor filter as shown in FIG. 3.

In FIG. 3, two CMOS operational amplifiers 11 and 12 are configured as a complete differential type to avert the influence of a clock signal. Capacitors $C_0$ connected in the feedback loops of these operational amplifiers 11 and 12 are so-called base capacitors. The coefficient ($a_{11}$ or others) is determined on the basis of a ratio ($C_1/C_0$) of the base capacitor ($C_0$) to the switching-controlled capacitor ($C_1$ or others) i.e., a so-called electric charge transfer capacitor $C_T$. A non-inversion input voltage $V_I$ is supplied to an input terminal 1 and an inversion input voltage $V_I$, is supplied to an input terminal 2 so as to correspond to the complete differential type operational amplifiers. Further, in FIG. 3 the circuit block 13 corresponds to the coefficient matrix, or input matrix, of the first term on the right side of the equation (2); the circuit block 14 corresponds to the coefficient matrix, or pole matrix, of the second term on the right side of the same equation (2).

Here, in order to realize the coefficients $a_{11}$ to $b_{22}$ in the switched-capacitor filter circuit, transmission gates and electric discharge transfer capacitors $C_T$ are necessary. Each coefficient $a_{11}$ to $b_{22}$ can be determined on the basis of the ratios $C_T/C_0$ of these capacitors $C_T$ to the base capacitor $C_0$ connected in the feedback loop of the operational amplifiers. In FIG. 3, these electric discharge transfer capacitors $C_T$ correspond to capacitors $C_1$ to $C_{10}$. However, as in $a_{12}Z^{-1}$ or $a_{22}Z^{-1}$ of the input matrix, when a unit of time, or one clock period, delay is required for the input voltage $V_I$, two electric discharge transfer capacitors $C_2$, $C_3$ or $C_7$, $C_8$ are respectively connected in sequence, so as to delay the signal electric charge by one clock, or one bit, for each two transfers. In this case, since the electric discharge to be transferred is, in practice, one-half, $C_2/C_0$ and $C_3/C_0$ are allowed to correspond to $2a_{12}$ which is twice as large as coefficient $a_{12}$; and $C_7/C_0$ and $C_8/C_0$ are allowed to correspond to $2a_{22}$, which is twice as large as coefficient $a_{22}$. Further, although the output of each operational amplifier 11 or 12 corresponds to the inner state voltage $V_1$ or $V_2$, since there exists a one clock, or one bit, delay with respect to the input $V_I$, one capacitor $C_4$, $C_5$, $C_9$ or $C_{10}$ is used, respectively, as electric discharge transfer capacitors for realizing the coefficient $b_{11}Z^{-1}$, $b_{12}Z^{-1}$, $b_{21}Z^{-1}$, or $b_{22}Z^{-1}$ of the pole matrix. However, since the inversion output of the operational amplifier is feedbacked to the non-inversion input thereof and the non-inversion output thereof is feedbacked to the inversion input thereof, respectively, and $(1-b_{11})$ corresponds to $C_4/C_0$ in coefficient $b_{11}$; $(1-b_{22})$ corresponds to $C_9/C_0$ in coefficient $b_{22}$.

Either one of the inner stage voltages $V_1$ or $V_2$ is taken as an output voltage $V_0$. In the example shown in FIG. 3, an output voltage $V_2$ of the inversion output terminal of the operational amplifier 12 is taken out through an output terminal 3 as a filter output voltage.

In the quadratic filter circuit as described above, since self feedback loops are provided for each operational amplifier 11 or 12, it is possible to obtain a stable operation.

Method of configuring n-th degree filter

The method of configuring any given quadratic filter circuit on the basis of the linear state method has been described above. In the same way, it is possible to configure any given n-th degree filter circuit on the basis of the linear state method.

Any given n-th degree transfer function H(Z) can be expressed as $$H(z) = \frac{a_n z^{-n} + a_{n-1} z^{-n+1} + \ldots + a_1 z^{-1} + a_0}{\beta_n z^{-n} + \beta_{n-1} z^{-n+1} + \ldots + \beta_1 z^{-1} + \beta_0} \quad (7)$$

Corresponding to this equation (7), an n-element linear simultaneous state equation for n-piece state voltages $V_1(Z)$ to $V_n(Z)$ of a circuit including an output voltage $V_0(Z)$ can be obtained as follows:

$$\begin{bmatrix} V_1(Z) \\ \vdots \\ V_n(Z) \end{bmatrix} = \begin{bmatrix} a_{11}a_{12}Z^{-1} \\ \vdots \\ a_{n2}a_{n2}Z^{-1} \end{bmatrix} \begin{bmatrix} V_I(Z) \\ V_I(Z) \end{bmatrix} + \begin{bmatrix} b_{11}Z^{-1} & \ldots & b_{1n}Z^{-1} \\ \vdots & & \vdots \\ b_{n1}Z^{-1} & \ldots & b_{nn}Z^{-1} \end{bmatrix} \begin{bmatrix} V_1(Z) \\ \vdots \\ V_n(Z) \end{bmatrix} \quad (8)$$

where $V_I(Z)$ denotes an input voltage.

The above equation can be obtained as follows: if the state voltage $V_n(Z)$ is determined as an output voltage $V_0(Z)$, for instance, the relationship between the output voltage $V_0(Z)$ ($=V_n(Z)$) and the input voltage $V_I(Z)$ is obtained by eliminating $V_1(Z)$ to $V_{n-1}(Z)$ from equation (8), and then an equation corresponding to equation (6) can be obtained by $H(Z)=V_0(Z)/V_I(Z)$. Thereafter, by comparing the coefficients of each term, respectively, it is possible to obtain the relationship between $a_n$ to $a_0$, $\beta_n$ to $\beta_0$ of equation (7) and $a_{11}$ to $a_{n2}$ and $b_{11}$ to $b_{nn}$ of equation (8).

Figure 4:
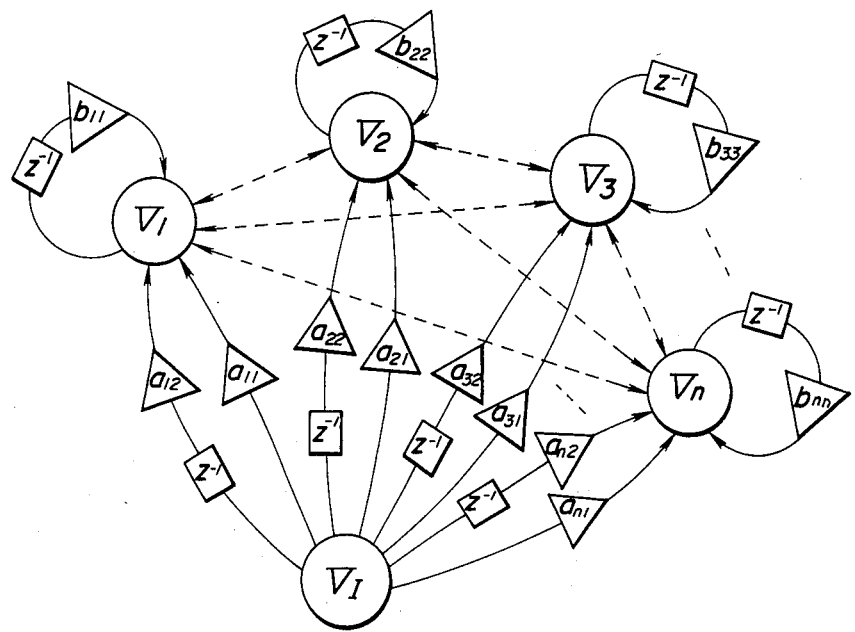
FIG. 4 is a state diagram corresponding to the one obtained by expanding the transfer function of an n-th degree filter to an n-element linear simultaneous state equation.

In the same way as in the above-mentioned quadratic filter, the n-element linear simultaneous state equation (8) can be expressed by a state diagram as shown in FIG. 4. As already described, this state diagram can be allowed to correspond to a practical circuit configuration in the same form.

Here, in considering the meanings of the simultaneous state equation (8) and the state diagram shown in FIG. 4, if the transfer function H(Z) of any given linear filter is expressed as $$H(Z) = \frac{V_0(Z)}{V_I(Z)} = \frac{a_{11} + a_{12}Z^{-1}}{1 - b_{11}Z^{-1}} \quad (9)$$

the state equation is $$V_0(Z) = [a_{11}a_{12}Z^{-1}]V_I(Z) + b_{11}Z^{-1}V_0(Z) \quad (10)$$

where $V_0(Z)$ denotes an output voltage and $V_I(Z)$ denotes an input voltage.

Figure 5:
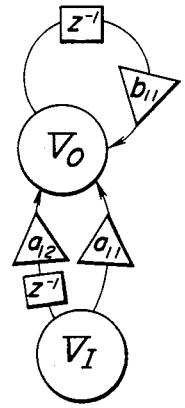
FIG. 5 is a state diagram corresponding to a linear filter.

The state diagram corresponding to this equation (10) becomes as shown in FIG. 5. In FIG. 5, the output voltage $V_0$ is self-attenuated by the coefficient $b_{11}$. This indicates an attenuation represented by $e^{-kt}$. The practical circuit can be configured by operational amplifiers which can effect self-feedback. Further, the input voltage $V_I$ is supplied to the operational amplifiers through transmission gates corresponding to $a_{12}Z^{-1}$ including coefficients $a_{11}$ or other and delay elements, thus contributing to the output voltage $V_0$.

Further, in the case where an n-th degree filter more than a quadratic filter is configured, the output voltage $V_0$ of the basic configuration shown in FIG. 5 is replaced with n-piece inner state voltages $V_1$ to $V_n$ and the mutual commutation is effected between state voltages $V_1$ to $V_n$, respectively; that is, so-called leapfrog resonance is effected as shown by the dashed lines in FIG. 4. In the practical circuit, this mutual communication can be realized by transferring signals via the transmission gates including delay elements and coefficients between two of the operational amplifiers, respectively.

Further, in the same way as in the already-mentioned quadratic filter, each coefficient $a_{11}$ to $a_{n2}$, or $b_{11}$ to $b_n$ of the simultaneous state equation expressed by equation (8) is determined as follows: the absolute values of the coefficients $a_{12}$ to $a_{n2}$ are changed so as to lie within a range between Ma and Mi with these values as variables; it is discriminated whether the absolute values of the coefficients $b_{11}$ to $b_{nn}$ at that moment lie within a range between Ma and Mi; and it is discriminated whether the inner state voltages $V_1$ to $V_n$ lie within an appropriate range, that is, between $P (= |V_0| max)$ and Q. Further, when a number of combinations of the coefficients $a_{11}$ to $a_{n2}$ and $b_{11}$ to $b_{nn}$ which satisfy these conditions are selected, a combination of the coefficients having a minimum difference between the maximum value and the minimum value in the same group of coefficient is selected as an optimum group of coefficients.

Further, without being limited to the above embodiments, it is possible to apply the present invention to various practical filter circuits such as digital filters other than switched-capacitor filters.

By the method of configuring n-th degree filters according to the present invention, it is possible to reliably configure filter circuits having any given n-th degree transfer function on the basis of the linear state method. Further, the coefficients of the filter lie within a range realized by hardware and further the inner state voltages lie within an appropriate range, so that it is possible to realize a high S/N ratio and a wide dynamic range. Further, it is possible to resonably and readily select the optimum filter coefficients having the minimum difference between the maximum value and the minimum value.

What is claimed is:

1. A method of configuring an n-th degree switched capacitor filter circuit having transfer characteristics expressed by $$H(z) = \frac{a_n z^{-n} + a_{n-1}z^{-n+1} + \ldots + a_1 z^{-1} + a_0}{B_n z^{-n} + B_{n-1}z^{-n+1} + \ldots + B_1 z^{-1} + B_0} \quad (1)$$

where n is greater than 1, z is a variable, and a and B are coefficients, as any given n-th degree transfer function $H(z)$, characterized in a step of expanding the above n-th degree transfer function $H(z)$ in the form of an n-element linear simultaneous state equation of n state voltages $V_1$ to $V_n$ inclusive of a last-stage output voltage as $$\begin{bmatrix} V_1 \\ \cdot \\ \cdot \\ \cdot \\ V_n \end{bmatrix} = \begin{bmatrix} a_{11}a_{12}z^{-1} \\ \cdot \\ \cdot \\ a_{n2}a_{n2}z^{-1} \end{bmatrix}\begin{bmatrix} V_I \\ \cdot \\ V_I \end{bmatrix} + \begin{bmatrix} b_{11}z^{-1} & \ldots & b_{1n}z^{-1} \\ \cdot & & \cdot \\ \cdot & & \cdot \\ b_{n1}z^{-1} & \ldots & b_{nn}z^{-1} \end{bmatrix}\begin{bmatrix} V_1 \\ \cdot \\ \cdot \\ V_n \end{bmatrix} \quad (2)$$

where $V_I$ denotes an input voltage, z is the variable, and a and b are coefficients calculated from the transformation of equation (1) to the linear simultaneous state equation (2) with respect to inner state voltages $V_1$ to $V_n$ of the filter circuit; and a step of configuring selected circuit components of a filter circuit to correspond practically to each of the coefficients $a_{11}$ to $b_{nn}$ determined in a solution to the n-element linear simultaneous state equation (2) above.

2. The method as set forth in claim 1, characterized in that the step of configuring includes the steps of changing each coefficient $a_{11}$ to $a_{n2}$, $b_{11}$ to $b_{nn}$ of the above linear simultaneous state equation (2) in a range within which the filter circuit can be configured with electrical components with each coefficient as a variable; determining a group of coefficients $a_{11}$ to $a_{n2}$ and $b_{11}$ to $b_{nn}$ so that each state voltage $V_1$ to $V_n$ is below a finally-obtained maximum output voltage; and configuring a filter circuit with said selected electrical components which correspond to each of the coefficients in the simultaneous state equation (2) and have each coefficient determined as recited in the linear simultaneous state equation (2).

3. The method as set forth in claim 2, characterized in that the step of determining the coefficients $a_{11}$ to $b_{nn}$ is performed in accordance with the following steps of:

(a) setting a lower limit Q of inner voltages to a maximum absolute value P of an output voltage $V_0$ $(Q = P + |V_o|max)$;

(b) setting a maximum value $M_a$ and a minimum value $M_i$ of each coefficient $a_{11}$ to $a_{n2}$, $b_{11}$ to $b_{nn}$ on the basis of electrical component limitation;

(c) repeatedly changing, if necessary, each absolute value of each coefficient $a_{11}$ to $a_{n2}$ within a range between the maximum value $M_a$ and the minimum value $M_i$ $(M_i \leq |a_{11}|$ to $|a_{n2}| \leq M_a)$ to obtain all possible combinations of coefficients $a_{11}$ to $a_{n2}$;

(d) discriminating whether all the combinations of coefficients $a_{11}$ to $a_{n2}$, $b_{11}$ to $b_{nn}$ have been selected;

(e) if the answer to step d is no, calculating all coefficients $b_{11}$ to $b_{nn}$ on the basis of the selected coefficient $a_{11}$ to $a_{n2}$ and the transfer function coefficients $a_o$ to $a_n$, to $B_o$ to $B_n$ in accordance with equations representative of a relationship between $a_{11}$ to $a_{n2}$ and $b_{11}$ to $b_{nn}$ through an intermediary of $a_o$ to $a_n$, $B_o$ to $B_n$;

(f) discriminating whether the absolute values of the calculated coefficients $b_{11}$ to $b_{nn}$ lie between the lower limit $M_l$ and the upper limit $M_a$ ($M_l \leq |b_{11}|$ to $|b_{nn}| \leq M_a$);

(g) if the answer to step (f) is no, returning to the above step (c) to change the combinations of coefficients $a_{11}$ to $a_{n2}$;

(h) if the answer to step (f) is yes, calculating inner state voltages $V_n$ in accordance with equations obtained by eliminating inner voltages other than $V_n$ on the basis of the simultaneous state equation (2) to determine a maximum absolute value $|V_n|$max;

(i) discriminating whether the calculated maximum absolute inner state voltage $|V_n|$max lies between the upper limit P and the lower limit Q ($Q \leq |V_n|$max$\leq P$);

(j) if the answer to step (i) is no, returning to the step (c) above;

(k) if the answer to step (i) is yes, incrementing control variable N;

(l) storing the maximum coefficient Kmax (N) and the minimum coefficient Kmin (N) among the determined coefficients $a_{11}$ to $a_{n2}$, $b_{11}$ to $b_{nn}$, and returning to the above step (c);

(m) if the answer is yes in step (a) above indicating all possible combinations of coefficients $a_{11}$ to $a_{n2}$, $b_{11}$ to $b_{nn}$ have been selected, discriminating whether the control variable N is zero;

(n) if the answer to step m is yes (N=0), reducing the lower limit Q and returning to the step (c) above; and (o) if the answer to step m is no (N$\neq$0), determining an optimum combination of coefficients $a_{11}$ to $a_{n2}$, $b_{11}$ to $b_{nn}$ having a minimum difference between the maximum coefficient value Kmax (N) and the minimum coefficient value Kmin (N).

4. A method of configuring a n-th degree switched capacitor filter circuit having transfer characteristics expressed by $$H(z) = \frac{a_n z^{-n} + a_{n-1} z^{-n+1} + \ldots + a_1 z^{-1} + a_0}{B_n z^{-n} + B_{n-1} z^{-n+1} + \ldots + B_1 z^{-1} + B_0}$$

where n is greater than 1, z is a variable, and a and B are coefficients; as any given n-th degree transfer function H(z), characterized in a step of expanding the above n-th degree transfer function H(z) in the form of an n-element linear simultaneous state equation of n state voltages $V_1$ to $V_n$ inclusive of a last-stage output voltage as $$\begin{bmatrix} V_1 \\ \cdot \\ \cdot \\ V_n \end{bmatrix} = \begin{bmatrix} a_{11}a_{12}z^{-1} \\ \cdot \\ \cdot \\ a_{n2}a_{n2}z^{-1} \end{bmatrix} \begin{bmatrix} V_I \\ V_I \end{bmatrix} + \begin{bmatrix} b_{11}z^{-1} \ldots b_{1n}z^{-1} \\ \cdot \quad \cdot \\ \cdot \quad \cdot \\ b_{n1}z^{-1} \ldots b_{nn}z^{-1} \end{bmatrix} \begin{bmatrix} V_1 \\ \cdot \\ \cdot \\ V_n \end{bmatrix}$$

where $V_I$ denotes an input voltage where z is the variable, and a and b are coefficients calculated from the transformation of equation (1) to the linear simultaneous state equation (2) with respect to inner state voltages $V_1$ to $V_n$ of the filter circuit; and a step of configuring components of a filter circuit to correspond practically to each of the coefficients $a_n$ to $b_{nn}$ determined in a solution to the n-element linear simultaneous state equation (2) above to provide an n-th degree switched capacitor filter so configured which comprises:

(a) a number n of differential operational amplifiers each including two base capacitors $C_o$ in each feedback loop thereof;

(b) an input circuit of said differential operational amplifiers having plural transmission gates and plural electric charge transfer capacitors $C_T$ for configuring the first term of the right side of the expanded n-element linear simultaneous state equation in such a way that each coefficient $a_{11}$ to $a_{n2}$ can be determined on the basis of each capacitors ratio $C_T C_o$ of the base capacitor $C_o$ to each electric charge transfer capacitor $C_T$ and the delay $Z^{-1}$ can be determined by additionally connecting another capacitor in series with $C_T$; and (c) an output circuit of said differential operational amplifiers having plural transmission gates and plural transmission gates and plural electric charge transfer capacitors $C_T$ for configuring the second term of the right side of the expanded n-element simultaneous state equation in such a way that each coefficient $b_{11}$ to $b_{nn}$ can be determined on the basis of each capacitance ration $C_T/C_o$ of the base capacitor $C_o$ to each electric charge transfer capacitor $C_T$ and the delay $Z^{-1}$ an be determined either by connecting each inversion output terminal to each non-inversion input terminal or by connecting each non-inversion input terminal to each inversion output terminal.

* * * * *